US012696785B2

(12) United States Patent
El Amrani et al.

(10) Patent No.: US 12,696,785 B2
(45) Date of Patent: Jul. 28, 2026

(54) HETEROGENEOUS SOLDER BUMP STRUCTURE

(71) Applicant: SOCIETE DE COMMERCIALISATION DES PRODUITS DE LA RECHERCHE APPLIQUÉE SOCPRA SCIENCES ET GENIE S.E.C., Sherbrooke (CA)

(72) Inventors: Abderrahim El Amrani, Sherbrooke (CA); Etienne Paradis, Sherbrooke (CA); David Danovitch, Sherbrooke (CA); Dominique Drouin, Sherbrooke (CA); Valerie Oberson, Markham (CA); Michel Turgeon, Markham (CA); Clement Fortin, Markham (CA)

(73) Assignee: SOCIETE DE COMMERCIALISATION DES PRODUITS DE LA RECHERCHE APPLIQUÉE SOCPRA SCIENCES ET GÉNIE S.E.C., Sherbrooke (CA)

( * ) Notice: Subject to any disclaimer, the term of this patent is extended or adjusted under 35 U.S.C. 154(b) by 440 days.

(21) Appl. No.: 18/276,787

(22) PCT Filed: Feb. 22, 2021

(86) PCT No.: PCT/CA2021/050201
§ 371 (c)(1),
(2) Date: Aug. 10, 2023

(87) PCT Pub. No.: WO2022/174324
PCT Pub. Date: Aug. 25, 2022

(65) Prior Publication Data
US 2024/0113060 A1 Apr. 4, 2024

(51) Int. Cl.
$H10W 72/20$ (2026.01)
$H10W 72/00$ (2026.01)
$H10W 90/00$ (2026.01)

(52) U.S. Cl.
CPC ......... $H10W 72/20$ (2026.01); $H10W 72/012$ (2026.01); $H10W 72/01235$ (2026.01); (Continued)

(58) Field of Classification Search
CPC ......... H01L 24/13; H01L 24/11; H01L 24/16; H01L 2224/11462; H01L 2224/11849; (Continued)

(56) References Cited

U.S. PATENT DOCUMENTS 5,130,779 A * 7/1992 Agarwala ............... H01L 24/11
257/772
6,501,185 B1 * 12/2002 Chow ..................... H01L 24/12
257/781

(Continued)

*Primary Examiner* — Douglas W Owens
(74) *Attorney, Agent, or Firm* — NORTON ROSE FULBRIGHT CANADA LLP

(57) ABSTRACT

There is provided a solder bump structure comprising an under bump metallurgy (UBM) layer, a first solder portion over the UBM layer, the first solder portion having a first composition, a barrier layer encapsulating the first solder portion, and a second solder portion over the barrier layer, the second solder portion having a second composition different from the first composition.

17 Claims, 4 Drawing Sheets

100

(52) U.S. Cl.
CPC .... *H10W 72/01257* (2026.01); *H10W 72/221* (2026.01); *H10W 72/222* (2026.01); *H10W 72/232* (2026.01); *H10W 72/252* (2026.01); *H10W 90/724* (2026.01)

(58) Field of Classification Search
CPC . H01L 2224/11901; H01L 2224/13006; H01L 2224/13014; H01L 2224/13084; H01L 2224/16225; H01L 2224/0345; H01L 2224/03462; H01L 2224/03464; H01L 2224/0347; H01L 2224/0361; H01L 2224/03912; H01L 2224/0401; H01L 2224/05083; H01L 2224/1147; H01L 2224/119; H01L 2224/1308; H01L 2224/13083; H01L 2224/131; H01L 2224/13562; H01L 2224/16227; H01L 2224/81948; H01L 24/92; H01L 2224/1601; H01L 2224/29099; H01L 2224/73204; H01L 2224/81399; H01L 2224/81815; H01L 2224/83102; H01L 2224/83399; H01L 2224/92125; H01L 2224/94; H01L 2924/351; H01L 2924/3511; H10W 72/20; H10W 72/012; H10W 72/01235; H10W 72/01257; H10W 72/221; H10W 72/222; H10W 72/232; H10W 72/252; H10W 90/724; H10W 99/00; H10W 72/01255; H10W 72/019; H10W 72/01935; H10W 72/01938; H10W 72/01953; H10W 72/01955; H10W 72/0198; H10W 72/072; H10W 72/07236; H10W 72/07252; H10W 72/073; H10W 72/245; H10W 72/255; H10W 72/29; H10W 72/351; H10W 72/923; H10W 72/951; H10W 72/952; H10W 74/15

See application file for complete search history.

(56) References Cited

U.S. PATENT DOCUMENTS

| | | | | |
|---|---|---|---|---|
| 8,507,317 | B2 | 8/2013 | Bachman et al. | |
| 10,522,491 | B2 * | 12/2019 | Hsiao | H01L 24/11 |
| 2002/0151164 | A1 * | 10/2002 | Jiang | H01L 24/12 |
| | | | | 257/E21.508 |
| 2009/0174052 | A1 | 7/2009 | Sogawa et al. | |
| 2014/0035131 | A1 | 2/2014 | Noh et al. | |
| 2019/0006312 | A1 * | 1/2019 | Arvin | H01L 23/49894 |
| 2019/0214358 | A1 * | 7/2019 | Ha | H01L 24/13 |
| 2021/0035937 | A1 | 2/2021 | Chen et al. | |

* cited by examiner

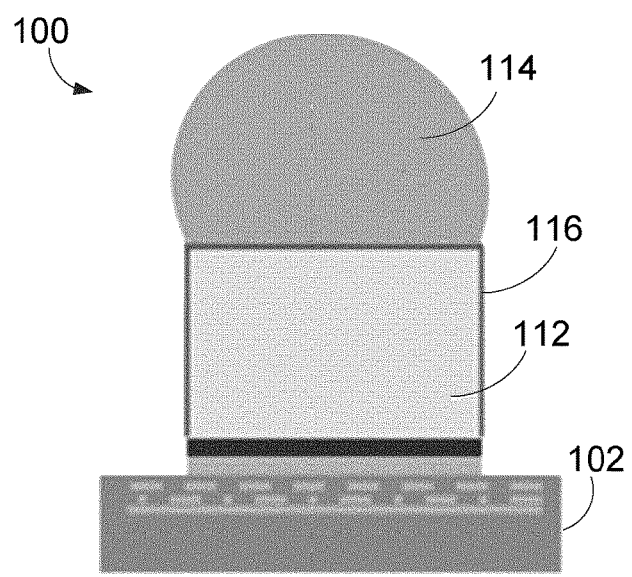
FIG. 2A
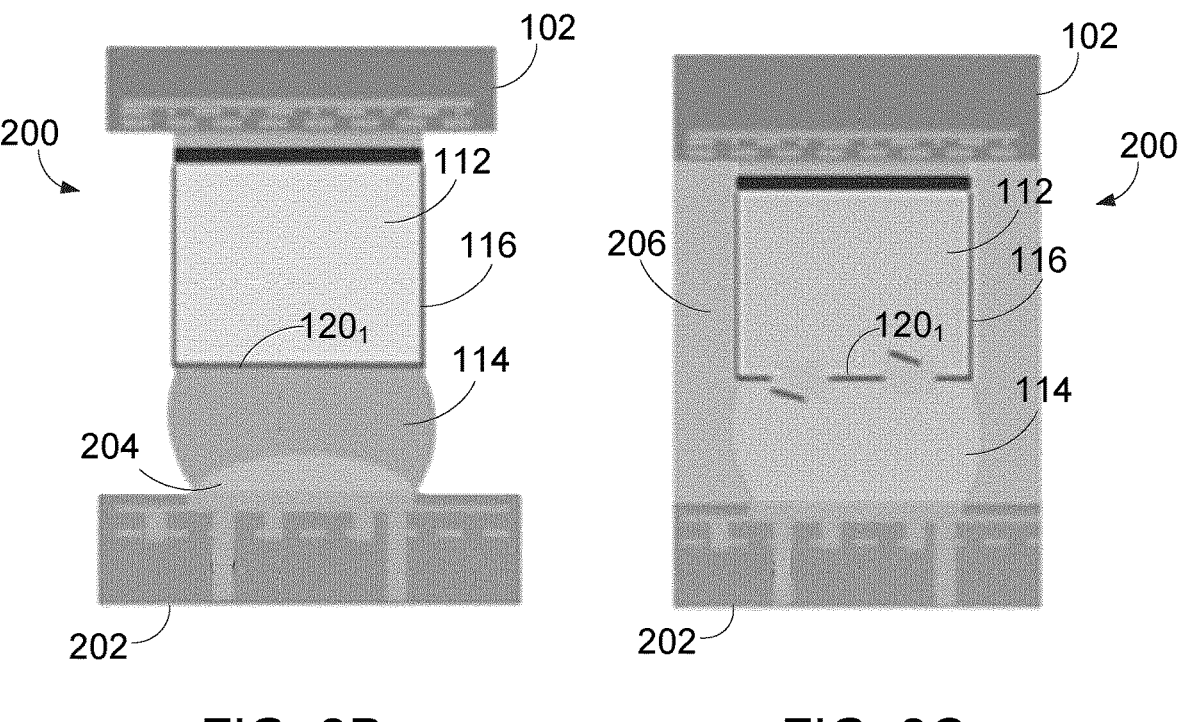
FIG. 2B
FIG. 2C

300

302

HETEROGENEOUS SOLDER BUMP STRUCTURE

The present application is a United States National Stage of International Application No. PCT/CA2021/050201, filed on Feb. 22, 2021, the contents of which are hereby incorporated by reference.

FIELD

The present disclosure relates generally to integrated circuit (IC) devices, and more particularly to IC devices having heterogeneous solder bump structures.

BACKGROUND

Flip chip technology has been broadly used for IC chip package assembly as an alternative to wire bonding for thinner and smaller packages due to its ability to cost-effectively increase system performance at higher density. Flip chip packaging utilizes bumps to establish electrical contact between the input/output pads of an IC chip and the substrate or lead frame of the package. Tin-silver (Sn—Ag) alloy-based solder compositions have become widely adopted for flip chip applications as a lead-free (Pb-free) solder alternative to traditional tin-lead (Sn—Pb) alloys.

However, in addition to issues such as environmental concerns and limited use of hazardous substances, which are solved by the use of tin-silver compositions, the electronic packaging community remains bounded by thermomechanical bump strength, electromigration (EM) resistance, and warpage accommodation, in which the silver (Ag) content of tin-silver alloy-based bumps plays a significant role. In particular, on the one hand, the need to ensure the lowest possible interconnect ductility near the back end of line (BEOL) region of the chip during chip-substrate interconnect solidification encourages the use of a low silver content, at least locally. On the other end, the increasing current densities of the chip interconnects favor a high silver content for optimal EM resistance.

Improvements are therefore needed to address the Ag-content dichotomy.

SUMMARY

In accordance with one aspect, there is provided a solder bump structure comprising an under bump metallurgy (UBM) layer, a first solder portion over the UBM layer, the first solder portion having a first composition, a barrier layer encapsulating the first solder portion, and a second solder portion over the barrier layer, the second solder portion having a second composition different from the first composition.

In some embodiments, the first solder portion has an upper surface, at least one side surface, and a lower surface positioned over the UBM layer, the barrier layer encapsulating at least part of the upper surface and the at least one side surface of the first solder portion.

In some embodiments, the barrier layer is configured to limit diffusion of material between the first solder portion and the second solder portion during multiple reflowing of the bump structure.

In some embodiments, at least part of the barrier layer is configured to break down, following post-underfill reflowing of the bump structure, to cause diffusion of material between the first solder portion and the second solder portion to homogenize an overall composition of the bump structure.

In some embodiments, the second solder portion exhibits a substantially hemispherical shape after a first reflowing of the bump structure.

In some embodiments, the barrier layer restrains the first solder portion to a substantially cylindrical shape during multiple reflowing of the bump structure.

In some embodiments, a portion of the UBM layer, the first solder portion, the barrier layer, and the second solder portion are formed by sequential electroplating.

In some embodiments, the first solder portion comprises a first solder layer electroplated over the UBM layer, and the second solder portion comprises at least one second solder layer electroplated over the barrier layer.

In some embodiments, each of the first layer and the at least one second layer is a tin (Sn) layer.

In some embodiments, the barrier layer comprise a layer of nickel (Ni).

In some embodiments, the second solder portion further comprises a silver (Ag) layer electroplated over the at least one second solder layer, the silver layer configured to diffuse into the tin layer after a first reflowing of the bump structure to cause the first solder layer to have a first silver content and the second solder portion to have a second silver content greater than the first silver content.

In some embodiments, the first silver content of the first solder portion is lower than 1 wt % and the second silver content of the second solder portion is greater than 3 wt %.

In some embodiments, the first silver content of the first solder portion is about 0 wt %.

In some embodiments, the UBM layer is configured to be deposited over an integrated circuit (IC) chip and the second solder portion is configured to form a solder joint with a substrate for interconnecting the IC chip and the substrate and forming a flip-chip assembly.

In accordance with another aspect, there is provided a method for manufacturing a solder bump structure, the method comprising depositing an under bump metallurgy (UBM) layer over an integrated circuit (IC) chip, depositing a first solder layer over the UBM layer, the first solder layer having a first composition, depositing a barrier layer that encapsulates the first solder portion, and depositing at least one second solder layer over the barrier layer, the at least one second solder layer having a second composition different from the first composition.

In some embodiments, the barrier layer is deposited to encapsulate at least part of an upper surface and at least one side surface of the first solder layer.

In some embodiments, the method further comprises performing a post-underfill reflow of the bump structure to break down at least part of the barrier layer and cause diffusion of material between the first solder layer and the at least one second solder layer for homogenizing an overall composition of the bump structure.

In some embodiments, performing the post-underfill reflow comprises performing a reflow cycle having a dwell duration of at least 120 seconds.

In some embodiments, a portion of the UBM layer, the first solder layer, the barrier layer, and the at least one second solder layer are deposited using a sequential electroplating process.

In some embodiments, depositing the first solder layer comprises electroplating a tin (Sn) layer over the UBM layer, and depositing the at least one second solder layer comprises electroplating at least one tin layer over the barrier layer.

In some embodiments, depositing the at least one second solder layer further comprises electroplating a silver (Ag) layer over the at least one tin layer electroplated over the barrier layer, the silver layer configured to diffuse into the at least one tin layer after a first reflowing of the bump structure to cause the first solder layer to have a first silver content and the at least one second solder layer to have a second silver content greater than the first silver content.

In some embodiments, depositing the barrier layer comprises electroplating a layer of nickel (Ni) over the first solder layer.

In some embodiments, depositing the barrier layer comprises creating a gap between the at least one side surface of the first solder layer and a photoresist, and infiltrating the gap with a barrier layer material.

In some embodiments, depositing the barrier layer comprises infiltrating the gap with the barrier layer material comprising a nickel (Ni) electrolyte.

Many further features and combinations thereof concerning embodiments described herein will appear to those skilled in the art following a reading of the instant disclosure.

DESCRIPTION OF THE FIGURES

In the figures,

FIG. 2A is a schematic diagram of the bump structure of FIG. 1, after reflow;

FIG. 2B is a schematic diagram of a joint structure achieved after chip-join of the bump structure of FIG. 2A;

FIG. 2C is a schematic diagram of the joint structure of FIG. 2B, after underfill and homogenization.

DETAILED DESCRIPTION

Described herein is a heterogeneous bump structure comprising portions having different compositions, e.g. varying silver (Ag) content. In one embodiment, the heterogeneous bump structure includes a temporary region of ductile, low silver content solder in the vicinity of brittle back end of line (BEOL) materials of an integrated circuit (IC) device. It is proposed to create the bump structure by means of a barrier layer that forms a substantially continuous cap over a first (e.g., low silver content) solder portion of the bump structure, the barrier layer limiting (i.e. controlling) subsequent diffusion of material (e.g., silver) within the bump structure. It is further proposed that the bump structure and barrier layer be accomplished using a sequential plating approach.

Figure 1:
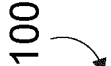
FIG. 1 is a schematic diagram of an example bump structure, before reflow, in accordance with one embodiment.
Figure 1:
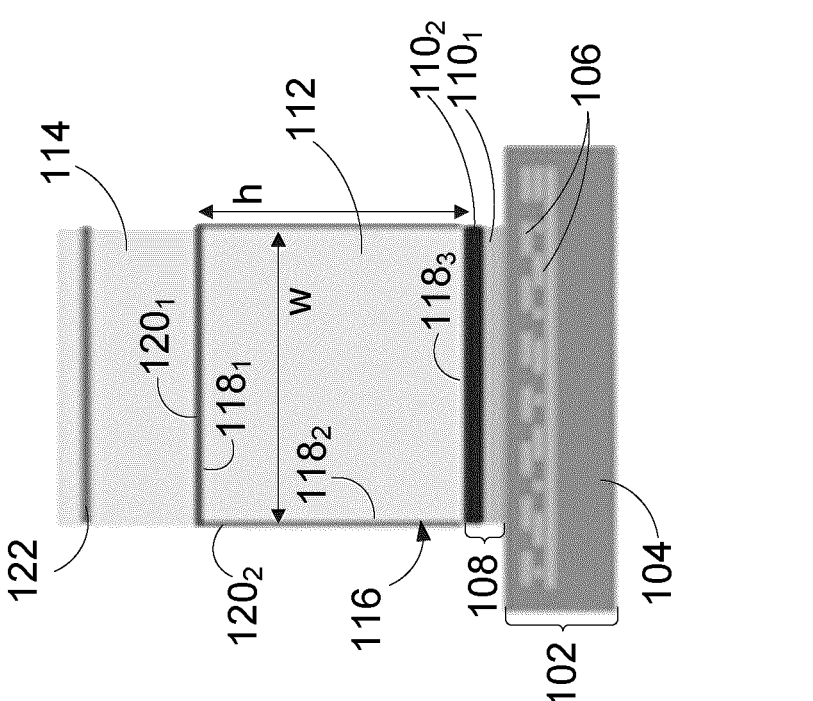

Referring now to FIG. 1, a bump structure 100 (also referred to as a "solder bump") will now be described, in accordance with one embodiment. The bump structure 100 is illustrated in FIG. 1 as-deposited (e.g., before reflow) and comprises various successive layers that will be described further below. The bump structure 100 is a solder bump structure that is used to join an IC chip (also referred to as a "semiconductor chip" or a "pad") 102 to a substrate (not shown) to form a flip chip packaging assembly (also referred to as a "flip chip package"). Although, for clarity purposes, a single bump structure 100 is illustrated and described herein as being formed on the IC chip 102, it should be understood that a plurality of bump structures as in 100 may be formed on the IC chip 102 for interconnecting the IC chip 120 to the substrate to form the flip chip packaging assembly.

The IC chip 102 comprises a substrate 104 onto which the bump structure 100 is applied. The substrate 104 may be any suitable substrate, such as a semiconductor substrate used in semiconductor IC fabrication. The substrate 104 may include, but is not limited to, a semiconductor wafer, a silicon-on-insulator (SOI) substrate, a silicon germanium substrate, or bulk silicon. The substrate 104 may have one or more ICs 106 formed therein (as illustrated) and/or thereupon. The ICs 106 may be formed in and/or on the substrate 104 using any suitable technique including, but not limited to, etching, annealing, implantation, lithographic processes, or patterned diffusion of trace elements. The ICs 106 may comprise any suitable microelectronic elements including, but not limited to, transistors, resistors, diodes, fuses, capacitors, and inductors, and are interconnected to form an IC device (e.g., a memory device, a system-on-chip device, a logic device, an input/out device, and the like).

The bump structure 100 comprises an under bump metallurgy (UBM) layer 108 that is applied over the IC chip 102 (and more specifically over the substrate 104) using any suitable technique. In one embodiment, electroplating is used to apply the UBM layer 108 over the IC chip 102. Other suitable techniques, including, but not limited to, physical vapor deposition (PVD), for example evaporation or sputtering, or an electroless plating process, may apply. As known to those skilled in the art, the UBM layer 108 provides a foundation for the solder of the bump structure 100 to adhere to upon reflow of the bump structure 100 and also prevents in-diffusion of solder into the IC chip 102. As known to those skilled in the art, reflow is a step in the manufacture of bump structures, which enables bump structures to exhibit a substantially spherical shape and allows activation of intermetallic diffusion within the bump structures. Multiple reflows may be required during a test and assembly process involving a given bump structure, such as the bump structure 100.

The UBM layer 108 may comprise one or more layers of material disposed (e.g., plated sequentially) over a passivation layer (not shown) applied to the substrate 104. In the illustrated embodiment, the UBM layer 108 comprises a first layer 1101 and a second layer 1102, which are successively applied to a passivation layer. The first layer 1101, which may be made of chromium (Cr), titanium tungsten (TiW), or any other suitable material, ensures adhesion of the bump structure to the IC chip. The material used as the final (or top) layer (e.g., layer 1102) of the UBM layer 108 is selected to ensure an intermetallic compound (IMC) connection between the solder portion(s) of bump structure 100 and the UBM layer 108 and may include means to control or limit IMC formation and/or reduce propensity for large $Ag_3Sn$ IMC formation within the bump structure 100.

As understood by those skilled in the art, large $Ag_3Sn$ IMCs form when exceeding a silver (Ag) content of 3 wt % and produce an undesirable fragile behaviour in bump structures that could in turn fail when subjected to the high stresses of chip-join interconnect solidification. In the illustrated embodiment, UBM layer 1102 is made of copper (Cu) and nickel (Ni). Although the UBM layer 108 is illustrated as comprising two layers 1101, 1102, where layer 1102 comprises two (2) metals, it should be understood that the UBM layer 108 may comprise more than two layers and each layer may comprise more than one metal. For example, in another embodiment, the UBM layer 1102 may be a Cu—Ni—Cu structure comprising a layer of copper, followed by a layer of nickel and by another layer of copper. It should however be understood that the UBM layer 108 may comprise any other suitable materials and/or combination of materials including, but not limited to titanium (Ti), gold (Au), and cobalt (Co). In one embodiment, the UBM layer 108 has a thickness between about 5 microns and about 8 microns. Other thicknesses may apply depending on the configuration of the flip chip assembly.

The bump structure 100 further comprises a first solder portion 112 overlying the UBM layer 108, a second solder portion 114, and a barrier layer 116 provided between the first solder portion 112 and the second solder portion 112. In one embodiment, the first solder portion 112, the second solder portion 114, and the barrier layer 116 are formed by sequential plating (e.g., using a sequential electroplating process). As understood by those skilled in the art, sequential plating is a sequential process that may be used to deposit at least a portion of the UBM layer and the solder bump constituents in their pure form in order to create a solder bump structure. It should however be understood that the first solder portion 112, the second solder portion 114, and the barrier layer 116 may be formed using any other suitable process including, but not limited to, serigraphy, evaporation, ball placement and Controlled Collapse Chip Connect—New Process (C4NP). It should also be understood that, although the first solder portion 112 and the second solder portion 114 are each illustrated in FIG. 1 as comprising a single layer, the second solder portion 114 may, in some embodiments, comprise several successive layers.

In one embodiment, the first solder portion 112 and second solder portion 114 are formed by sequential electroplating and are each made of at least one layer of pure tin (Sn) (i.e. having a composition of 100% tin). It should however be understood that the first and second solder portions 112, 114 may be made of any other suitable material(s) that may be either co-deposited or deposited sequentially. This includes, but is not limited to, a tin-based alloy (e.g., tin-silver (SnAg), tin-silver-copper (SnAgCu), and tin-bismuth-silver (SnBiAg)).

Still referring to FIG. 1, the barrier layer 116 is used to ensure heterogeneity in composition within the bump structure 100 (e.g., to maintain a silver concentration gradient between the neighboring solder portions 112 and 114) prior to underfill. In particular, the barrier layer 116 enhances the integrity of the first solder portion 112 and limits diffusion of material (e.g., silver) within the bump structure 100 during multiple reflow cycles, until the chip-joining stage. Homogenization of the composition (e.g., of the silver content) within the bump structure 100 is achieved as a result of the barrier layer 116 breaking down after a post-underfill long dwell reflow cycle, thus allowing for optimal electro migration (EM) resistance.

In one embodiment, the barrier layer 116 is a cap-like barrier layer (referred to herein as a "barrier cap") that encapsulates (or caps) the first solder portion 112. Specifically, the first solder portion 112 has an upper (or top) surface 1181, at least one side surface 1182, and a lower (or bottom) surface 1183 positioned over the UBM layer 108. The barrier layer 116 is applied over the upper surface 1181 and over the at least one side surface 1182 of the first solder portion 112. The barrier layer 116 has an upper portion 1201 that encompasses the upper surface 1181 of the first solder portion 112 and extends across the width (w) of the first solder portion 112. The barrier layer 116 also has at least one side portion 1202 that encompasses the at least one side surface 1182 of the first solder portion 112 and extends along the height (h) of the first solder portion 112. In other words, the barrier layer 116 forms a substantially continuous cap that substantially fully encompasses the exposed surfaces 1181, 1182 of the first solder portion 112. It should be understood that, while the barrier layer 116 is illustrated in FIG. 1 as fully encapsulating the first solder portion 112, the barrier layer 116 may encompass part of the exposed surfaces 1181, 1182 of the first solder portion 112, and may therefore partially encapsulate the first solder portion 112. For example, in some embodiments, the barrier layer 116 may not completely extend (i.e. at the at least one side surface 1182) to reach the UBM layer 108. While the amount of coverage afforded by the barrier layer 116 may vary, it may be desirable for the barrier layer 116 to provide as much coverage of the first solder portion 112 as possible, so as to encompass most of the exposed surfaces 1181, 1182. In this manner, it may be possible to minimize the amount of solder that may escape from the first solder portion 112 through openings in the barrier layer 116.

The barrier layer 116 may be made of any suitable material and may have any suitable thickness. In some embodiments, it may be desirable for the barrier layer 116 to be made of pure nickel (Ni) because this material may reduce propensity for large IMC formation within the bump structure 100. In other embodiments, the barrier layer 116 may be made of a nickel-copper (Ni—Cu) alloy. It should be understood that any suitable material may apply. In one embodiment, the barrier layer 116 has a thickness of about 0.5 μm. In some embodiments, a thickness of the upper portion 1201 of the barrier layer 116 is greater than that of the at least one side portion 1202 of the barrier layer 116.

In order to achieve a heterogeneous bump structure 100 where the first solder portion 112 has a composition, e.g. a silver content (or concentration, i.e. a percentage of silver), that is different from the composition (e.g., silver content) of the second solder portion 114 during all solder reflow processes (or cycles) that occur prior to a reinforcing underfill, a layer 122 of silver (Ag) is deposited over the second solder portion 114 (i.e. over the tin layer). It should however be understood that the layer 122 may comprise any suitable material other than silver. After a first reflow cycle (or step), local diffusion of the layer 122 (e.g., the silver layer) into the tin layer of the second solder portion 114 occurs such that the first solder portion 112 temporarily has a first composition (e.g., silver content) and the second solder portion 114 temporarily has a second composition (e.g., silver content) that is different from the first composition.

In one embodiment, the first solder portion 112 temporarily has a first silver content and the second solder portion 114 temporarily has a second silver content that is greater than the first silver content. In one embodiment, the first silver content is less than about 1 wt % (weight percent) and the second silver content is greater than about 3 wt %. In one embodiment, the first silver content is about 0 wt %. The first silver content (which composes the first solder portion 112 provided adjacent the IC chip 102) may therefore be referred to as a "low" silver content while the second silver content (which composes the second solder portion 114 provided adjacent the substrate the IC chip 102 is to be jointed to) may be referred to as a "high" silver content. In other words, the first solder portion 112 temporarily (i.e. until underfill and homogenization) has a low silver content while the second solder portion 114 temporarily has a high silver content.

The volume of tin plated in the first and second solder portions 112, 114 may vary to define a desired shape of the bump structure 100 after reflow. In one embodiment, it may be desirable to maximize the volume of tin plated in the first solder portion 112 in order to achieve a pillar-like shape for the bump structure 100 and maintain the high silver content (found in the second solder portion 114) away from the IC chip 102 (and particularly from its BEOL region, not shown). In one embodiment, achieving the pillar-like bump structure 100 may enable a high-density interconnect design without the use of a stiff copper structure. In other words, in one embodiment, the nickel-capped and pillar-shaped bump structure 100 described herein may be used as an alternative to the stiff copper pillars generally used in micro-bump applications. Maintaining the low silver content near the BEOL (and the high silver content away from the BEOL) during the critical step of solder joint solidification may reduce the stress-induced failure on fragile interconnects.

Referring now to FIG. 2A, FIG. 2B, and FIG. 2C in addition to FIG. 1, the IC chip 102 with the bump structure 100 formed thereon is reflowed. A joint structure 200 is then formed by assembling the bump structure 100 face down on another substrate 202 to form a flip chip packaging assembly. It should be understood that, although FIG. 2A depicts a first reflow cycle prior to assembly, the first reflow cycle and assembly could be effected concurrently. For the purpose of assembly, the IC chip 102 and bump structure 100 are flipped upside down and attached to the substrate 202 (as can be seen in FIGS. 2B and 2C) using any suitable attaching process. As known to those skilled in the art, the bump structure 100 provides electrical contacts and forms a mechanical and thermal connection between the substrates 104 and 202. The substrate 202 may be any suitable substrate including, but not limited to, a board (e.g., a printed circuit board (PCB)) and a package substrate.

FIG. 2A shows the bump structure 100 of FIG. 1 after a first reflow cycle. In one embodiment, the first reflow cycle has a dwell duration of 60 seconds. As used herein, the term "dwell duration" (or dwell) refers to the timeframe during which the bump structure 100 remains in liquid form. As can be seen in FIG. 2A, the first solder portion 112 is restrained by the barrier layer 116 and retains a substantially as-plated cylindrical (or columnar) shape. In particular, the barrier layer 116 prevents the lateral expansion of the first solder portion 112 (i.e. expansion at the at least one side surface $119_2$), which is typically inherent to a melted solder tension during reflow. In contrast, the geometry of the second solder portion 114 has changed from an as-plated cylinder (as shown in FIG. 1) to a substantially hemispherical shape (as shown in FIG. 2A). A pillar-like shape with an increased bump aspect-ratio (as compared to a conventional unrestrained solder bump) is therefore achieved in the bump structure 100. As can also be seen in FIG. 2A, local diffusion of silver (from the silver layer 118) occurs within the second solder portion 114 after the first reflow cycle, leading to the second solder portion 114 having a high silver content and the first solder portion 112 having a low silver content. Indeed, as described herein above, reflowing of the bump structure 100 allows for activation of intermetallic diffusion within the bump structure 100. The first reflow cycle not only enables diffusion between the tin (Sn) layer of the first solder portion 112 and the last layer (reference 1102 in FIG. 1) of the UBM layer (reference 108 in FIG. 1) to enhance adhesion of the bump structure 100 to the UBM layer 108, but also enables local diffusion of silver within the second solder portion 114.

FIG. 2B shows the resultant joint structure 200 after chip-join. In FIG. 2B, the bump structure 100 is flipped upside down and attached to the substrate 202, with a solder joint 204 being formed at the intersection between the substrate 202 and the second solder portion 114. In one embodiment, assembly of the bump structure 100 onto the substrate 202 may be accomplished by a pick and place tool followed by a standard reflow chip-join cycle having a duration of 60 seconds. It can be seen from FIG. 2A and FIG. 2B that the distinct compositions of the solder portions 112, 114 (i.e. the low and high silver content) separated by the barrier layer 116 are maintained prior to underfill. It can be further seen from FIG. 2B that the increased bump aspect-ratio achieved in the bump structure 100 of FIG. 2A translates to an increased solder joint aspect-ratio as compared to a conventional unrestrained solder joint, resulting in higher chip to substrate stand-off which may facilitate flux cleaning (to remove flux residues that main remain at the time of soldering) and underfill flow.

FIG. 2C shows the joint structure 200 after application of a reinforcing capillary underfill 206 between the IC chip 102 and the substrate 202 and after a post-underfill reflow cycle, which results in homogenization of the composition (e.g. silver content) within the joint structure 200. As known to those skilled in the art, the underfill 206 is used to reduce mechanical constraints that may be applied on the joint structure 200 as well as protect the joint structure 200 from the outside environment. In one embodiment, the underfill 206 may be applied by needle dispense at a temperature of 100° C. on a hotplate, followed by a curing bake of two (2) hours at 150° C., and the post-underfill reflow cycle may be performed in an $N_2$ environment furnace. As can be seen in FIG. 2C, at least part of the barrier layer 116 breaks down after the post-underfill reflow cycle. In particular, the upper portion 1201 of the barrier layer 116 is broken down while the at least one side portion (reference 1202 in FIG. 1) of the barrier layer 116 has remained intact. It should however be understood that the at least one side portion 1202 need not remain intact during the post-underfill reflow cycle and that at least part of the at least one side portion 1202 may also break down after the post-underfill reflow cycle. The (at least partial) breakdown of the barrier layer 116 causes diffusion of material (e.g., silver) between the first solder portion 112 (e.g., which has a low silver content) and the second solder portion 114 (e.g., which has a high silver content). The overall composition (e.g., the overall silver content) of the bump structure 100 is therefore homogenized, with the first solder portion 112 and the second solder portion 114 having substantially the same composition (e.g., silver content). Therefore, in one embodiment, a homogeneous interconnect bump structure 100 is created which has an overall silver content sufficient to encourage EM resistance.

The dwell duration of the post-underfill reflow cycle is determined in order to achieve the desired homogenization. To this effect, it is proposed herein for the post-underfill reflow cycle to have a longer dwell duration than that of the prior reflow cycle(s). In one embodiment, the bump structure 100 and/or the joint structure 200 are exposed to one or more initial reflow cycles, prior to underfill, having a dwell duration of 60 seconds (as described above), followed by a post-underfill (or homogenization) reflow cycle having a dwell duration of 240 seconds. Other embodiments may apply and it should be understood that the dwell duration of the post-underfill reflow cycle may vary, so long as this dwell duration is sufficient to allow the barrier layer 116 to break down to allow for diffusion of material (e.g., silver)

between the first solder portion 112 and the second solder portion 114. Depending upon the maximum temperature during this dwell duration, the dwell duration may vary, for example between 120 seconds and 360 seconds. It is therefore proposed herein for the post-underfill reflow cycle to have a dwell duration of at least 120 seconds.

Figure 3A:
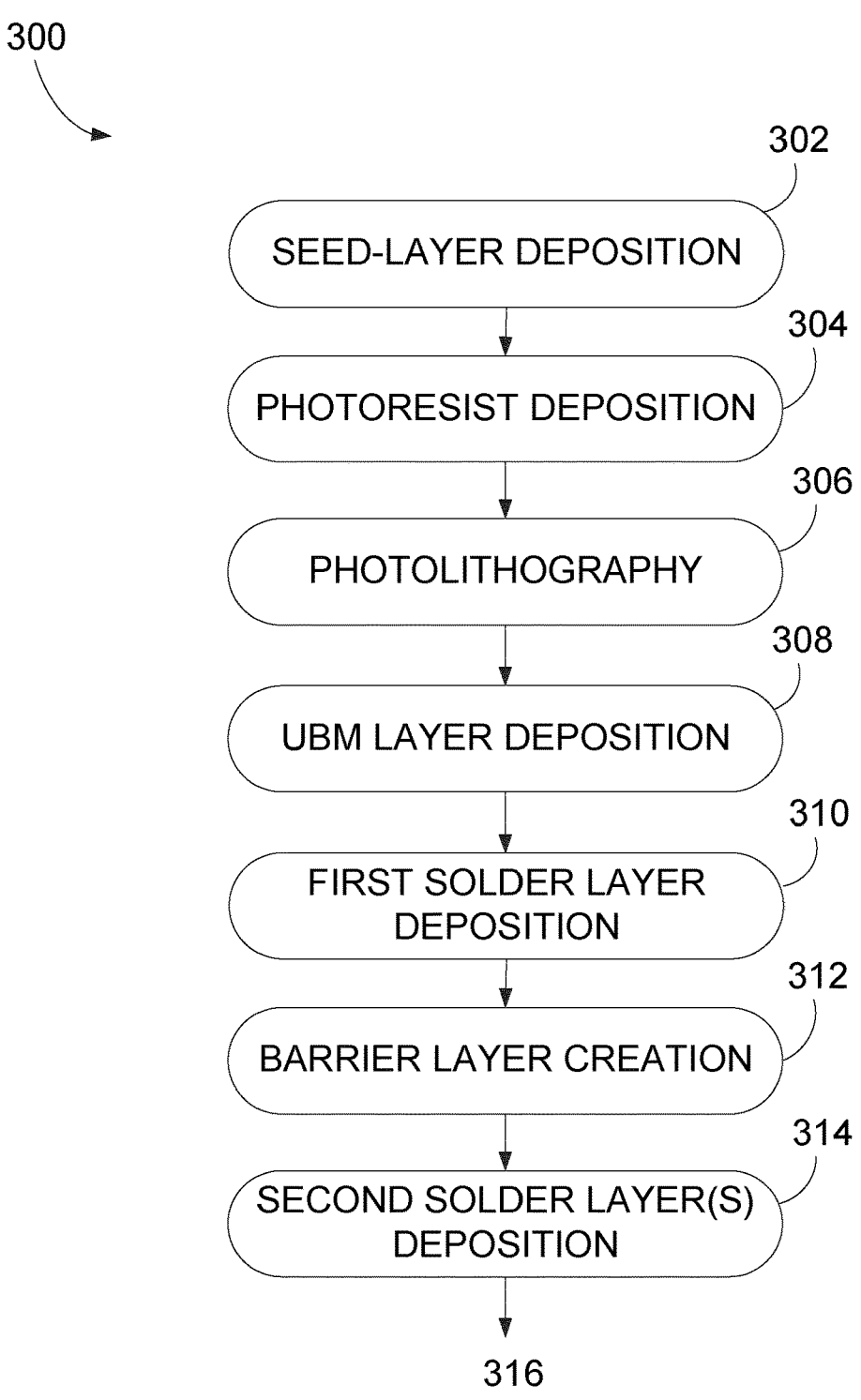
FIG. 3A and FIG. 3B are flowcharts of a method for forming a bump structure, in accordance with one embodiment.
Figure 3B:
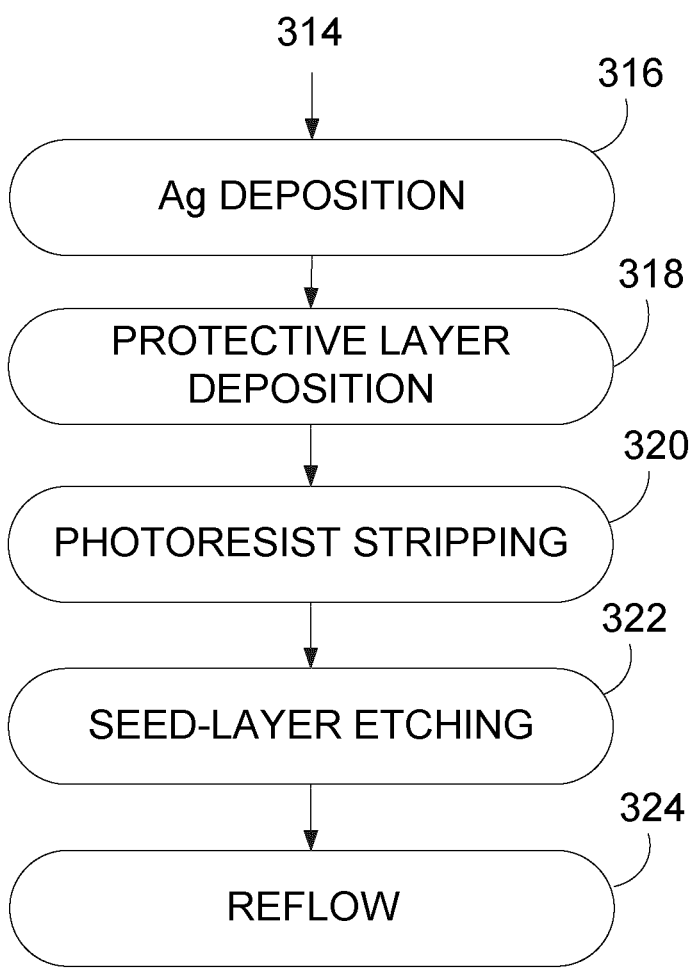

FIG. 3A and FIG. 3B illustrate a flowchart of a method 300 used to manufacture a bump structure (such as the bump structure 100 described above in reference to FIG. 1), in accordance with one embodiment. In one embodiment, the method 300 uses a sequential plating approach. It should however be understood that other suitable techniques may be used to form the bump structure. The method 300 first comprises proceeding with seed-layer deposition at step 302. In one embodiment, 300 mm blank wafers having a thickness of 775 µm may be used and step 302 may comprise sputtering a titanium tungsten-copper (TiW—Cu) seed-layer onto a 500 nm thick thermally grown $SiO_2$ layer. The next step 304 is to proceed with photoresist deposition, followed by photolithography at step 306. In one embodiment, a 75 µm thick dry-film photoresist may be laminated and patterned through a 180 mJ/cm$^2$ UV exposure and developed by a 1% sodium carbonate solution, thereby creating a plating mask. It should be understood that other means of photoresist deposition, including, but not limited to, spin-coating of a liquid photoresist, may be used.

As described above, it is proposed herein to then proceed with a sequential plating process in order to deposit the remaining portions of the UBM layer and the solder bump constituents. It should however be understood that other suitable techniques may be used for deposition. UBM layer deposition (e.g., UBM plating) is therefore performed at step 308, followed by deposition (e.g., plating) of a first solder layer at step 310. In one embodiment, step 308 comprises plating a copper layer followed by a nickel layer to complete the UBM layer, and step 310 comprises plating a layer of tin as the first solder layer, as described above in reference to FIG. 1. In order to create a heterogeneous solder composition, method 300 further comprises the step 312 of barrier layer creation. As described above with reference to FIG. 1, the barrier layer is formed as a cap that encompasses the first solder layer deposited at step 310. In one embodiment, the barrier layer is created at step 312 by plating a layer of nickel (Ni) over a top surface and side surface(s) of the first solder layer plated at step 310. Any suitable technique may be used to create the barrier layer at step 312. In one embodiment, a vertical gap may be created between the deposited bump constituents (i.e. the layers deposited at steps 308 and 310) and the photoresist. The gap may then be infiltrated with a nickel electrolyte in order to create the barrier layer at step 312, the resulting barrier layer encapsulating (or capping) the top and side surface(s) of the first solder layer.

The method 300 then proceeds to the step 314 of depositing (e.g., plating) one or more second solder layers over the barrier layer created at step 312. In one embodiment, the second solder layer(s) deposited at step 314 are one or more layers of tin (Sn). The method 300 then proceeds with silver (Ag) deposition (e.g., plating) at step 316 to create a desired silver content for the bump structure. For this purpose, a layer of silver is plated at step 316 over the last one of the second solder layer(s) deposited at step 314. As it should however be understood that, as described herein above, any suitable material other than silver may be deposited at step 316. A protective layer is then deposited (e.g., plated) at step 318. In one embodiment, the protective layer deposited at step 318 is a layer of tin (Sn). The next step 320 then consists of stripping the photoresist deposited at step 304. The seed-layer deposited at step 302 is then etched at step 322 and the method 300 proceeds with reflow at step 324. In one embodiment, the reflow process performed at step 324 may be achieved in an eight (8) zone $N_2$ environment industrial furnace. Other embodiments may apply. The bump structure formed after the reflow process of step 324 illustratively has a pillar-like shape, with a first solder portion having a first composition (e.g., low silver content) and a generally cylindrical shape, a second solder portion having a second composition (e.g., high silver content) and a generically hemispherical shape, and a barrier layer encapsulating the first solder portion and separating it from the second solder portion (as illustrated in FIG. 2A).

As described herein above, in one embodiment, the proposed solder bump structure may enable to improve barrier integrity over multiple solder reflow cycles, especially for high aspect ratio solder bump structures (i.e. solder bump structure where the height to diameter ratio is above 1:1). This may in turn improve the ability of the solder bump structure to maintain a desired heterogeneous composition (e.g., silver composition) during the multiple solder reflow cycles, while allowing the solder bump structure to have a homogeneous composition (e.g., silver content) through a final (post-underfill) reflow of sufficient dwell duration. In one embodiment, the solder bump structure proposed herein exhibits a columnar (or-pillar-like) shape that can be maintained during packaging assembly processes. The solder bump structure may therefore provide comparable aspect ratios to copper pillar structures without the stiffness of copper, a stiffness which may induce failure in device BEOL structures. In one embodiment, the proposed solder bump structure may also allow for plating at small diameters (e.g., between 10 µm and 90 µm), thus providing an improvement over conventional solder bump structures for a given bump pitch (i.e. a given distance between centers of adjacent bumps) with respect to resultant assembly features, namely a gap between the IC chip and the substrate and/or joint-to-joint spacing.

As used herein, the term "about" used in connection with a quantity or value should be understood to be inclusive of the stated quantity or value. The term "about" should be understood to have a meaning dictated by the context. For example, the term "about" should be understood to include a degree of tolerance or error associated with measurement of the particular quantity. Ranges disclosed herein should be understood to be inclusive and independently combinable. For example, ranges are inclusive of the endpoints and all intermediate values of the ranges. Further, it should be understood that, when a layer is referred to herein as being "on" or "over" another layer or substrate, the layer may be directly on or over the other layer or substrate or intervening layer(s) may be present.

The above description is meant to be exemplary only, and one skilled in the art will recognize that changes may be made to the embodiments described without departing from the scope of the invention disclosed. Still other modifications which fall within the scope of the present invention will be apparent to those skilled in the art, in light of a review of this disclosure.

Various aspects of the disclosed solder bump structure, and associated methods of manufacture, may be used alone, in combination, or in a variety of arrangements not specifically discussed in the embodiments described in the foregoing and it is therefore not limited in its application to the details and arrangement of components set forth in the foregoing description or illustrated in the drawings. For example, aspects described in one embodiment may be combined in any manner with aspects described in other embodiments. Although particular embodiments have been shown and described, it will be obvious to those skilled in the art that changes and modifications may be made without departing from this invention in its broader aspects. The scope of the following claims should not be limited by the embodiments set forth in the examples, but should be given the broadest reasonable interpretation consistent with the description as a whole Although the embodiments have been described in detail, it should be understood that various changes, substitutions and alterations can be made herein without departing from the scope as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized. Accordingly, the appended claims are intended to include within their scope such processes, machines, manufacture, compositions of matter, means, methods, or steps.

As can be understood, the examples described above and illustrated are intended to be exemplary only. The scope is indicated by the appended claims.

What is claimed is:

1. A solder bump structure comprising:
an under bump metallurgy (UBM) layer;
a first solder portion over the UBM layer, the first solder portion having a first composition;
a barrier layer encapsulating the first solder portion; and
a second solder portion over the barrier layer, the second solder portion having a second composition different from the first composition,
wherein the barrier layer is configured to limit diffusion of material between the first solder portion and the second solder portion during multiple reflowing of the bump structure, and further wherein at least part of the barrier layer is configured to break down, following post-underfill reflowing of the bump structure, to cause diffusion of material between the first solder portion and the second solder portion to homogenize an overall composition of the bump structure.

2. The bump structure of claim 1, wherein the first solder portion has an upper surface, at least one side surface, and a lower surface positioned over the UBM layer, the barrier layer encapsulating at least part of the upper surface and the at least one side surface of the first solder portion.

3. The bump structure of claim 1, wherein the second solder portion exhibits a substantially hemispherical shape after a first reflowing of the bump structure.

4. The bump structure of claim 3, wherein the barrier layer restrains the first solder portion to a substantially cylindrical shape during multiple reflowing of the bump structure.

5. The bump structure of claim 1, wherein a portion of the UBM layer, the first solder portion, the barrier layer, and the second solder portion are formed by sequential electroplating.

6. The bump structure of claim 5, wherein the first solder portion comprises a first solder layer electroplated over the UBM layer, and the second solder portion comprises at least one second solder layer electroplated over the barrier layer.

7. The bump structure of claim 6, wherein each of the first layer and the at least one second layer is a tin (Sn) layer.

8. The bump structure of claim 1, wherein the barrier layer comprises a layer of nickel (Ni).

9. The bump structure of claim 7, wherein the second solder portion further comprises a silver (Ag) layer electroplated over the at least one second solder layer, the silver layer configured to diffuse into the tin layer after a first reflowing of the bump structure to cause the first solder layer to have a first silver content and the second solder portion to have a second silver content greater than the first silver content.

10. The bump structure of claim 9, wherein the first silver content of the first solder portion is lower than 1 wt % and the second silver content of the second solder portion is greater than 3 wt %.

11. The bump structure of claim 1, wherein the UBM layer is configured to be deposited over an integrated circuit (IC) chip and the second solder portion is configured to form a solder joint with a substrate for interconnecting the IC chip and the substrate and forming a flip-chip assembly.

12. A method for manufacturing a solder bump structure, the method comprising:
depositing an under bump metallurgy (UBM) layer over an integrated circuit (IC) chip;
depositing a first solder layer over the UBM layer, the first solder layer having a first composition;
depositing a barrier layer that encapsulates the first solder layer;
depositing at least one second solder layer over the barrier layer, the at least one second solder layer having a second composition different from the first composition; and
performing a post-underfill reflow of the bump structure to break down at least part of the barrier layer and cause diffusion of material between the first solder layer and the at least one second solder layer for homogenizing an overall composition of the bump structure.

13. The method of claim 12, wherein the barrier layer is deposited to encapsulate at least part of an upper surface and at least one side surface of the first solder layer.

14. The method of claim 12, wherein a portion of the UBM layer, the first solder layer, the barrier layer, and the at least one second solder layer are deposited using a sequential electroplating process.

15. The method of claim 14, wherein depositing the first solder layer comprises electroplating a tin (Sn) layer over the UBM layer, and depositing the at least one second solder layer comprises electroplating at least one tin layer over the barrier layer, and further wherein depositing the at least one second solder layer further comprises electroplating a silver (Ag) layer over the at least one tin layer electroplated over the barrier layer, the silver layer configured to diffuse into the at least one tin layer after a first reflowing of the bump structure to cause the first solder layer to have a first silver content and the at least one second solder layer to have a second silver content greater than the first silver content.

16. The method of claim 12, wherein depositing the barrier layer comprises electroplating a layer of nickel (Ni) over the first solder layer.

17. The method of claim 13, wherein depositing the barrier layer comprises creating a gap between the at least one side surface of the first solder layer and a photoresist, and infiltrating the gap with a barrier layer material comprising a nickel (Ni) electrolyte.

* * * * *